(12) United States Patent
Lin et al.

(10) Patent No.: US 12,381,082 B2
(45) Date of Patent: Aug. 5, 2025

(54) SEMICONDUCTOR STRUCTURE, METHOD FOR FABRICATING THEREOF, AND METHOD FOR FABRICATING SEMICONDUCTOR LAYOUT

(71) Applicant: Fujian Jinhua Integrated Circuit Co., Ltd., Fujian (CN)

(72) Inventors: Gang-Yi Lin, Quanzhou (CN); Yu-Cheng Tung, Quanzhou (CN); Yi-Wang Jhan, Quanzhou (CN); Yifei Yan, Quanzhou (CN); Xiaopei Fang, Quanzhou (CN)

(73) Assignee: Fujian Jinhua Integrated Circuit Co., Ltd., Fujian Province (CN)

( * ) Notice: Subject to any disclaimer, the term of this patent is extended or adjusted under 35 U.S.C. 154(b) by 0 days.

(21) Appl. No.: 18/603,246

(22) Filed: Mar. 13, 2024

(65) Prior Publication Data
US 2024/0222124 A1    Jul. 4, 2024

Related U.S. Application Data

(62) Division of application No. 17/706,613, filed on Mar. 29, 2022, now Pat. No. 11,996,290.

(30) Foreign Application Priority Data

Aug. 11, 2021 (CN) .......................... 202110919203.0
Aug. 11, 2021 (CN) .......................... 202121875153.2

(51) Int. Cl.
*H01L 21/033* (2006.01)
*H01L 21/768* (2006.01)
*H01L 23/528* (2006.01)

(52) U.S. Cl.
CPC ...... *H01L 21/0338* (2013.01); *H01L 21/0335* (2013.01); *H01L 21/0337* (2013.01); *H01L 21/76892* (2013.01); *H01L 23/528* (2013.01)

(58) Field of Classification Search
CPC ............. H01L 21/0335; H01L 21/0337; H01L 21/0338
See application file for complete search history.

(56) References Cited

U.S. PATENT DOCUMENTS

| | | |
|---|---|---|
| 7,794,920 B2 | 9/2010 | Choi |
| 8,921,016 B1 | 12/2014 | Kallingal |

(Continued)

OTHER PUBLICATIONS

Yan, the specification, including the claims, and drawings in the U.S. Appl. No. 17/555,532, filed Dec. 20, 2021.

*Primary Examiner* — Walter H Swanson
(74) *Attorney, Agent, or Firm* — Winston Hsu

(57) ABSTRACT

A method for fabricating a semiconductor structure includes the following steps. Decomposing a layout to first connection patterns and second connection patterns alternatively arranged with each other, where a to-be-split pattern is disposed between the first connection pattern and the second connection pattern; splitting the to-be-split pattern into a cutting portion and a counterpart cutting portion; forming a first photomask having a layout constructed by the first connection pattern and the cutting portion; forming a second photomask having a layout constructed by the second connection pattern and the counterpart cutting portion; transferring layouts of the first and second photomasks to a target layer to form connection patterns and a merged pattern, where the contour of the merged pattern is defined by the cutting portion and the counterpart cutting portion, and each end surface of the merged pattern comprises a recessed region and a protruded region.

10 Claims, 10 Drawing Sheets

(56) References Cited

U.S. PATENT DOCUMENTS

| | | |
|---|---|---|
| 9,147,035 B1 | 9/2015 | Huang |
| 9,477,804 B2 | 10/2016 | Su |
| 9,785,046 B2 | 10/2017 | Hsieh |
| 2008/0010628 A1 | 1/2008 | Jung |
| 2008/0222587 A1 | 9/2008 | Smayling |
| 2009/0298205 A1 | 12/2009 | Nagahara |
| 2013/0024824 A1 | 1/2013 | Huang |
| 2013/0219347 A1 | 8/2013 | Zou |
| 2013/0232456 A1 | 9/2013 | Kallingal |
| 2013/0328155 A1 | 12/2013 | Konomi |
| 2016/0147140 A1 | 5/2016 | Hsieh |
| 2016/0188781 A1 | 6/2016 | Hamouda |
| 2018/0144082 A1 | 5/2018 | Hanchinal |
| 2018/0341736 A1 | 11/2018 | Chen |
| 2019/0034577 A1 | 1/2019 | Wang |
| 2019/0035631 A1* | 1/2019 | Chang ................. H01L 21/0337 |
| 2019/0067292 A1* | 2/2019 | Feng ...................... H10B 12/34 |
| 2020/0118812 A1 | 4/2020 | Chang |
| 2020/0321215 A1 | 10/2020 | Fan |
| 2022/0373877 A1 | 11/2022 | Yang |
| 2024/0147684 A1 | 5/2024 | Liaw |

\* cited by examiner

SEMICONDUCTOR STRUCTURE, METHOD FOR FABRICATING THEREOF, AND METHOD FOR FABRICATING SEMICONDUCTOR LAYOUT

CROSS REFERENCE TO RELATED APPLICATIONS

This application is a division of U.S. application Ser. No. 17/706,613, filed on Mar. 29, 2022. The content of the application is incorporated herein by reference.

BACKGROUND OF THE INVENTION

1. Field of the Invention

The present invention relates to the technical field of manufacturing semiconductor, in particular to a semiconductor structure, a method for fabricating thereof and a method for fabricating a semiconductor layout adopting double patterning technology.

2. Description of the Prior Art

In the fabrication of integrated circuits (ICs), photolithography has been an essential technique. At present, the resolution required by photolithography at 32 nm node and below has exceeded the limit capability of the present mask aligner. Therefore, the double patterning technique (DPT), which can enlarge the minimum pattern distance on the present mask aligner, has become the solution for the line width between 32 nm to 22 nm. DPT technology includes decomposing a set of high-density circuit patterns into two or more sets of low-density circuit patterns; then fabricating photomasks having the sets of low-density circuit patterns respectively which can be used in the corresponding exposure and etching processes; and finally forming a merged pattern corresponding to the high-density patterns as originally required.

However, because DPT must go through multiple exposure processes, overlay control and alignment have always been a concern of DPT, and the problem of overlay control and alignment is more prominent when the high-density circuit pattern is decomposed into two or more sets of circuit patterns with lower density. When overlay errors or inaccurate alignment occur in DPT, it will lead to disconnection or connection of circuit patterns, resulting in serious open circuit or short circuit.

Therefore, there is still a need in the industry for a method for fabricating semiconductor layout and a semiconductor structure fabricated by adopting the layout that can overcome the above problems.

SUMMARY OF THE INVENTION

The present invention provides a semiconductor structure, a method for fabricating thereof and a method for fabricating a semiconductor layout to solve the issues such as the occurrence of broken lines and merged connection lines during the double patterning technique.

According to a first aspect of the present invention, there is provided a semiconductor structure. The semiconductor includes a substrate, a plurality of connection patterns and a merged pattern, wherein the connection patterns are disposed on the substrate, the merged pattern is disposed between the adjacent connection patterns, wherein the merged pattern includes a first outer line, a central line and a second outer line sequentially arranged along a first direction, and an end surface of the first outer line, an end surface of the central line and an end surface of the second outer line are misaligned to each other along the first direction.

According to a second aspect of the present invention, there is provided a method for fabricating a semiconductor structure. The method includes providing a layout, wherein the layout includes a plurality of connection patterns and at least one to-be-split pattern; decomposing the layout to a plurality of first connection patterns and a plurality of second connection patterns alternatively arranged with each other, wherein the to-be-split pattern is disposed between the first connection pattern and the second connection pattern; splitting the to-be-split pattern into a cutting portion and a counterpart cutting portion; forming a first photomask having a layout constructed by the first connection pattern and the cutting portion; forming a second photomask having a layout constructed by the second connection pattern and the counterpart cutting portion; providing a substrate, wherein a target layer is disposed on the substrate; and transferring a layout of the first photomask and a layout of the second photomask to the target layer to form a plurality of connection patterns and a merged pattern, wherein the contour of the merged pattern is defined by the cutting portion and the counterpart cutting portion, the merged pattern comprises two end surface disposed opposite each other, and each of the end surfaces comprises a recessed region and a protruded region.

According to a third aspect of the present invention, there is provided a method for fabricating a semiconductor layout. The method includes providing a layout, wherein the layout includes a plurality of connection patterns and at least one to-be-split pattern; decomposing the layout into a plurality of first connection patterns and a plurality of second connection patterns, wherein the to-be-split pattern is disposed between the first connection pattern and the second connection pattern adjacent to the first connection pattern; splitting the to-be-split pattern into an original cutting portion and an original counterpart cutting portion, wherein a boundary line is located between the original cutting portion and the original counterpart cutting portion; moving the boundary line of the original cutting portion to form a modified cutting portion, wherein the area of the modified cutting portion is larger than the area of the original cutting portion; and forming a photomask having the first connection patterns and the modified cutting portion.

According to a method for fabricating a semiconductor layout of one embodiment of the present invention, a to-be-split pattern with wider width is split into an original cutting portion and an original counterpart cutting portion, and a boundary line located between the original cutting portion and the original counterpart cutting portion is moved to form a modified cutting portion and a modified counterpart cutting portion both with larger areas. Then, the modified cutting portion and the modified counterpart cutting portion are formed in two photomasks respectively, and the two photomasks are transferred to a target layer, the merged pattern of the formed semiconductor structure is defined by the cutting portion and the counterpart cutting portion, which can be ensured that there will be no disconnection between the two outer lines of the merged pattern corresponding to the cutting portion and the counterpart cutting portion, so as to improve the reliability of the formed semiconductor structure. The semiconductor structure, the method for fabricating thereof and the method for fabricating the semiconductor layout of the present invention can effectively and reliably fabricate circuit patterns with high density and large difference in partial pattern sizes without increasing the process complexity.

These and other objectives of the present invention will no doubt become obvious to those of ordinary skill in the art after reading the following detailed description of the preferred embodiment that is illustrated in the various figures and drawings.

DETAILED DESCRIPTION

For better understanding of the present invention, some embodiments of the present invention are listed below with the accompanying drawings, the composition and the desired effects of the present invention are described in detail for those skilled in the art.

Figure 1:
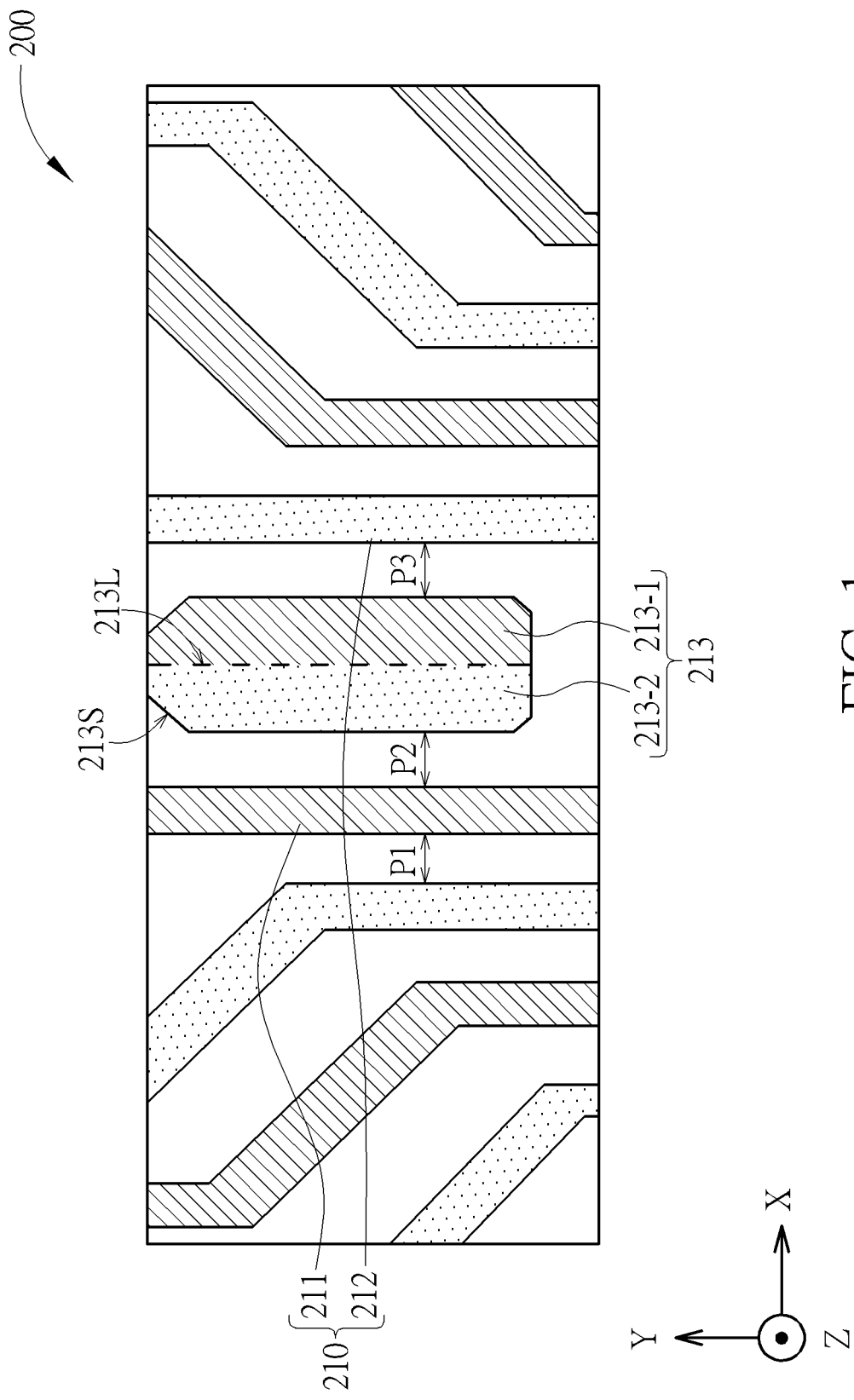
FIG. 1 is a schematic plan view of a layout for fabricating a semiconductor structure according to one embodiment of the present invention.

Please refer to FIG. 1, which is a schematic plan view of a layout 200 for fabricating a semiconductor structure according to one embodiment of the present invention. As shown in FIG. 1, the layout 200 may be a layout of metal connection layers for fabricating semiconductor devices (for example, memory devices such as dynamic random access memory or static random access memory), such as the layout of a 0-th metal layer (M0) and a first metal layer (M1), but is not limited thereto. The layout 200 includes a plurality of connection patterns 210 and at least one to-be-split pattern 213. The connection patterns 210 may be decomposed to a plurality of first connection patterns 211 and a plurality of second connection patterns 212 alternatively arranged with each other, and the to-be-split pattern 213 is arranged between the first connection pattern 211 and the second connection pattern 212 adjacent to the first connection pattern 211. The first connection patterns 211 and the second connection patterns 212 are alternately arranged along a first direction (e.g., the x direction shown in FIG. 1), and each extends along a second direction (e.g., the y direction shown in FIG. 1). It should be noted that part of the connections among the first connection patterns 211 and the second connection patterns 212 may not extend along the second direction, but on the whole, each of the first connection patterns 211 and the second connection patterns 212 may be regarded as extending along the second direction.

According to one embodiment of the present invention, the minimum pattern spacing of the layout 200 violates the predetermined rule of photolithography, that is, a spacing P1 between two adjacent first and second connecting patterns 211, 212, a spacing P2 between the to-be-split pattern 213 and the first connecting pattern 211 adjacent thereto, and a spacing P3 between the to-be-split pattern 213 and the second connecting pattern 212 adjacent thereto violate the predetermined rule of photolithography. When the layout 200 violates the predetermined rule of photolithography, the corresponding pattern formed on the photomask may cause significant light diffraction during the photolithography, and thus the pattern may not be exactly and completely transferred to the semiconductor wafer. In one embodiment, the minimum pattern distance of the layout 200 is, for example, 52 nm, that is, the spacing P1 between each of the first connection patterns 211 and each of the second connection patterns 212 adjacent to the first connection patterns 211 may be 52 nm, and the distance P2 between the to-be-split pattern 213 and the first connecting pattern 211 adjacent thereto and the distance P3 between the to-be-split pattern 213 and the second connecting pattern 212 adjacent thereto may also be 52 nm. In addition, along the first direction, the width of the to-be-split pattern 213 is larger than the width of each first connection pattern 211 and each second connection pattern 212. In one embodiment, the width of the to-be-split pattern 213 may be 2 to 3 times the width of the first wiring pattern 211 and the width of the second wiring pattern 212.

According to one embodiment of the present invention, the to-be-split pattern 213 may be split into an original cutting portion 213-1 and an original counterpart cutting portion 213-2, and a boundary line 213L is included between the original cutting portion 213-1 and the original counterpart cutting portion 213-2, wherein the original cutting portion 213-1 is in proximity to the second connection pattern 212 and the original counterpart cutting portion 213-2 is in proximity to the first connection pattern 211. In addition, as shown in FIG. 1, at least one upper corner of the to-be-split pattern 213 is cut off (or regarded as being truncated), so that the upper corner becomes a bevel edge 213S. The to-be-split pattern 213 with the bevel edge 213S may increase the distance between the corner of the to-be-split pattern 213 and the first connection pattern 211 adjacent to the to-be-split pattern 213, thereby reducing the possibility of interconnection between the pattern formed by the to-be-split pattern 213 and the connection pattern adjacent to the to-be-split pattern 213 after the photolithography, and avoiding or reducing the short circuit between the formed circuit patterns. In one embodiment, the four corners of the to-be-split pattern 213 may be cut off to form four bevel edge, so that the distance between each of the four corners of the to-be-split pattern 213 and the first connection pattern 211 adjacent to the to-be-split pattern 213 or the second connection pattern 212 adjacent to the to-be-split pattern 213 is increased, which further ensures that no short circuit will occur between the formed circuit patterns.

Figure 2:
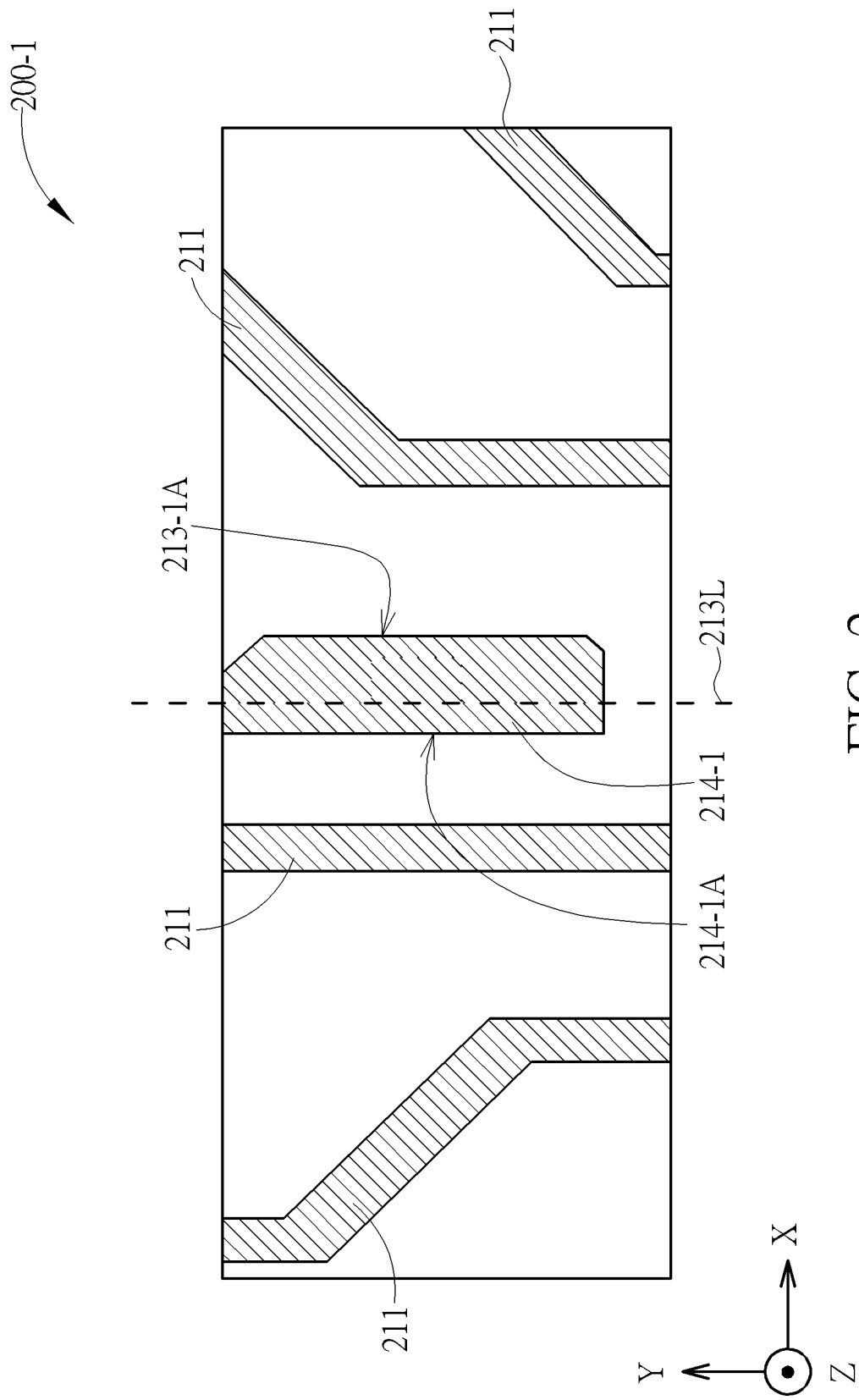
FIG. 2 is a schematic plan view of a discomposed layout for fabricating a semiconductor structure according to one embodiment of the present invention.
Figure 3:
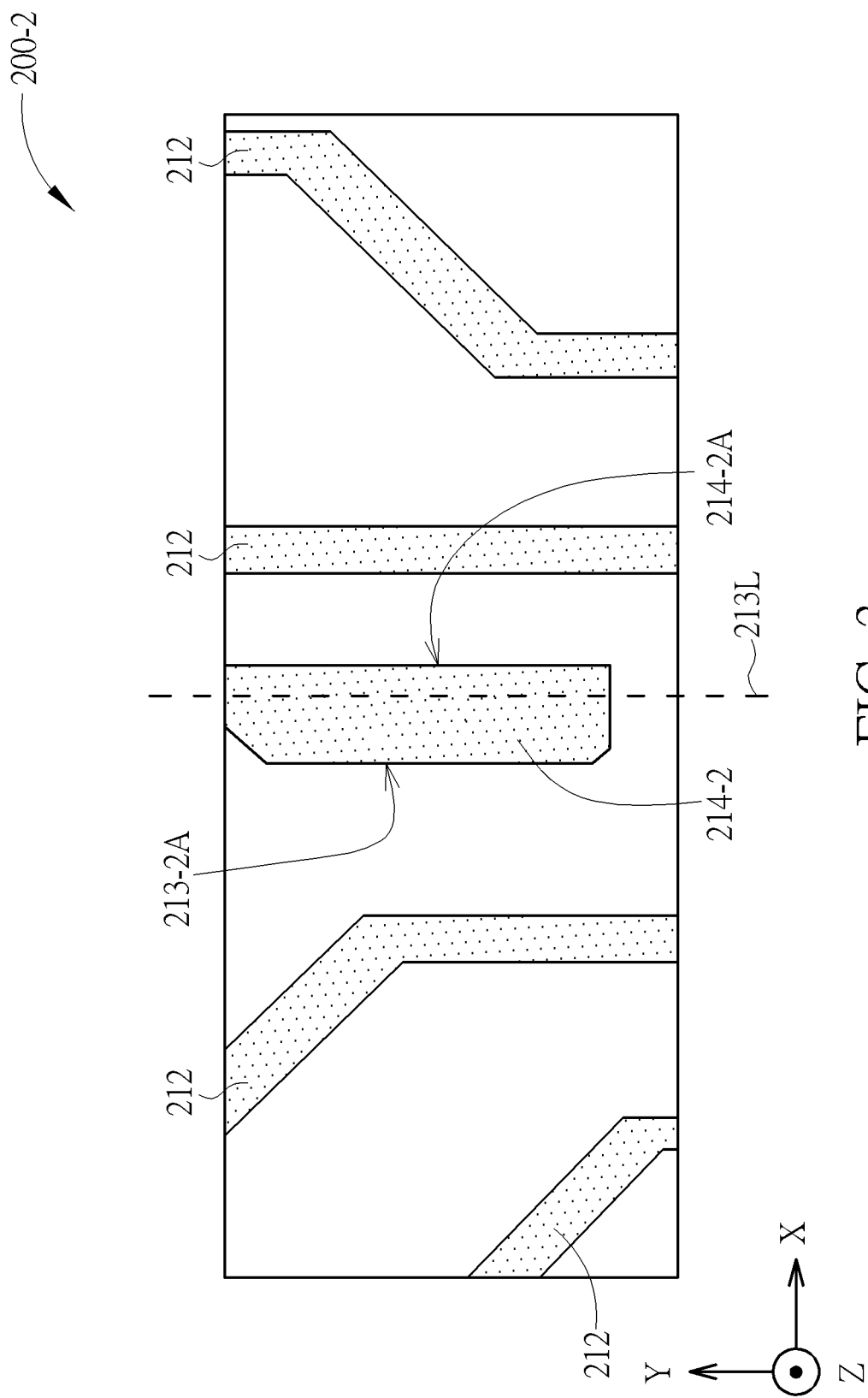
FIG. 3 is a schematic plan view of another discomposed layout for fabricating a semiconductor structure according to one embodiment of the present invention.

Then, the first connection pattern 211, the second connection pattern 212, the original cutting portion 213-1 and the original counterpart cutting portion 213-2 may be decomposed into different layouts to thereby obtain the layouts shown in FIGS. 2 and 3. In addition, the layouts shown in FIG. 2 and FIG. 3 are only illustrations, and the patterns in these layouts may be further modified (for example, optical proximity correction), so that the contours of the patterns before and after correction are different from each other.

Please refer to FIG. 2, which is a discomposed layout 200-1 for fabricating a semiconductor structure according to one embodiment of the present invention. As shown in FIG. 2, the discomposed layout 200-1 includes a plurality of first wiring patterns 211 and a modified cutting portion 214-1. In detail, the modified cutting portion 214-1 is formed by moving the boundary line 213L of the original cutting portion 213-1, and an end surface 213-1A of the original cutting portion 213-1 away from the boundary line 213L is immobilized. The boundary line 213L is moved along the first direction to the direction close to the original counterpart cutting portion 213-2 to form an end surface 214-1A of the modified cutting portion 214-1, and the area of the formed modified cutting portion 214-1 is larger than that of the original cutting portion 213-1. In one embodiment, the ratio of the area of the modified cutting portion 214-1 to the area of the original cutting portion 213-1 may be 1.05 to 1.50.

Please refer to FIG. 3, which is a schematic plan view of another discomposed layout 200-2 for fabricating a semiconductor structure according to one embodiment of the present invention. As shown in FIG. 3, the another decomposed layout 200-2 includes a plurality of second wiring patterns 212 and a modified counterpart cutting portion 214-2. In detail, the modified counterpart cutting portion 214-2 is formed by moving the boundary line 213L of the original counterpart cutting portion 213-2, and an end surface 213-2A of the original counterpart cutting portion 213-2 away from the boundary line 213L is immobilized. The boundary line 213L is moved toward the original cutting portion 213-1 along the first direction to form the end surface 214-2A of the modified counterpart cutting portion 214-2, and the area of the formed modified counterpart cutting portion 214-2 is larger than that of the original counterpart cutting portion 213-2. In one embodiment, the ratio of the area of the modified counterpart cutting portion 214-2 to the area of the original counterpart cutting portion 213-2 may be 1.05 to 1.50.

According to one embodiment of the present invention, it is not limited to moving the boundary line 213L of the original cutting portion 213-1 in FIG. 2 and the boundary line 213L of the original counterpart cutting portion 213-2 in FIG. 3. According to actual requirements, it is also possible to move only the boundary line 213L of the original cutting portion 213-1 without moving the boundary line 213L of the original counterpart cutting portion 213-2. Alternatively, only the boundary line 213L of the original counterpart cutting portion 213-2 is moved without moving the boundary line 213L of the original cutting portion 213-1.

According to one embodiment of the present invention, the decomposed layout 200-1 including the first wiring patterns 211 and the modified cutting portion 214-1 is formed on at least one photomask, and another decomposed layout 200-2 including the second wiring patterns 212 and the modified counterpart cutting portion 214-2 is formed on another at least one photomask. In addition, according to actual requirements, the decomposed layout 200-1 and the another decomposed layout 200-2 may be further modified (for example, optical proximity correction) before being fabricated into different photomasks.

Figure 4:
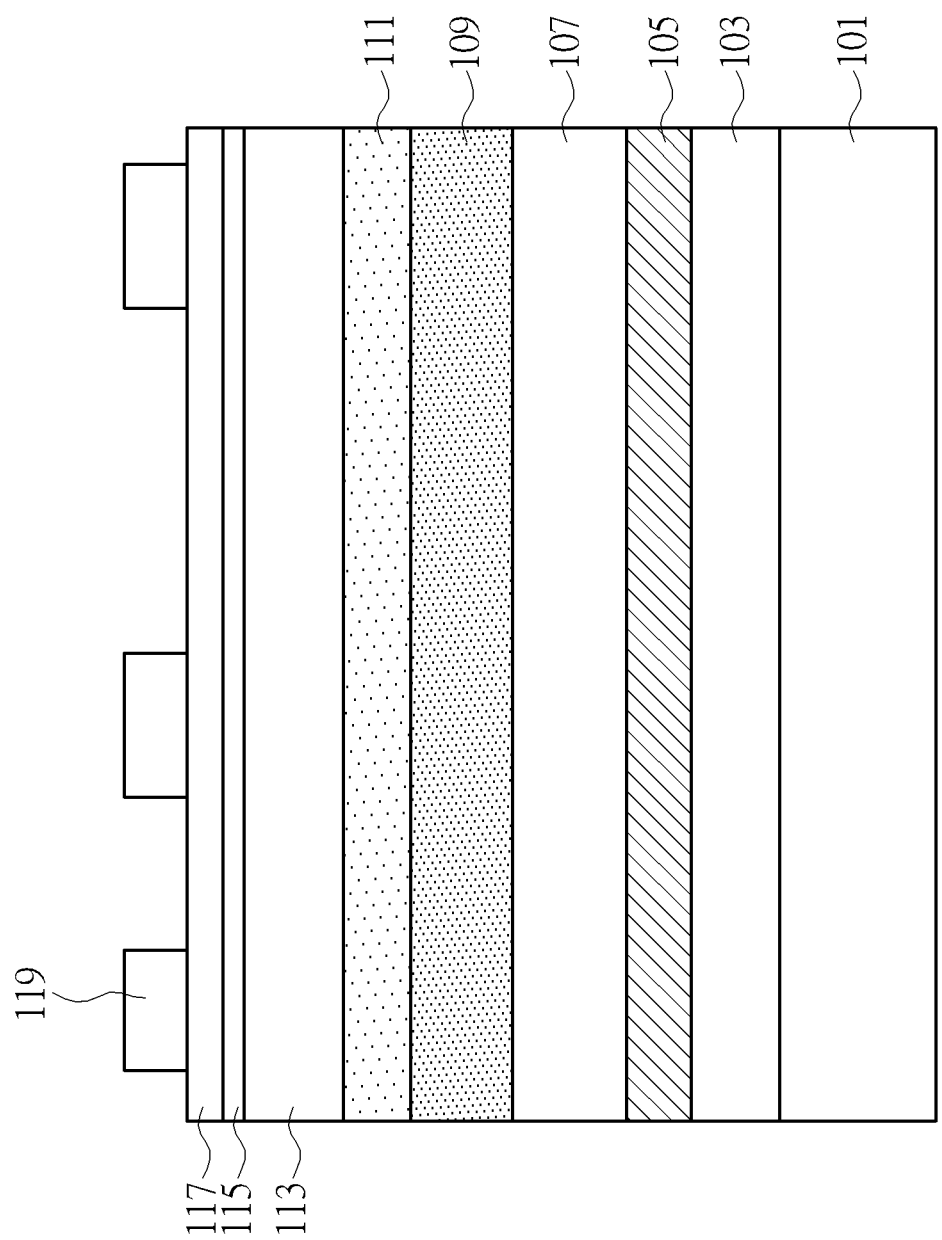
FIGS. 4 to 8 are schematic cross-sectional views of each stage of the method for fabricating the semiconductor structure according to one embodiment of the present invention.

Next, please refer to FIGS. 4 to 8, which are schematic cross-sectional views of each stage of the method for fabricating the semiconductor structure according to one embodiment of the present invention. First, as shown in FIG. 4, a substrate 101 is provided, which may be a silicon substrate, a silicon-on-insulator (SOI) substrate or other semiconductor substrates. A diffusion barrier layer 103, a target layer 105, a protective layer 107, a bottom mask layer 109, a top mask layer 111, a photoresist bottom layer 113, a photoresist intermediate layer 115 and a bottom anti-reflective coating (BARC) layer 117 are sequentially deposited on the substrate 101, and a patterned photoresist layer 119 is formed on the substrate 101. In one embodiment, the material of the diffusion barrier layer 103 is, for example, titanium nitride (TiN), tantalum nitride (TaN) or other suitable diffusion barrier materials, which may be used to prevent metal atoms in the upper layer from diffusing to the layer underneath. The target layer 105 is, for example, a conductive layer including a metal layer, a metal alloy layer or a combination of the above, such as a tungsten layer. The target layer 105 may be patterned by photolithography to form a connection pattern in the subsequent processes. The protective layer 107 may be a dielectric material, such as silicon nitride, silicon oxide, silicon oxynitride or a combination thereof, and covers the target layer 105 to protect the underlying target layer 105 during the photolithography process. The material of the bottom mask layer 109 is, for example, amorphous silicon, and the pattern of the aforementioned decomposed layout 200-1 and the decomposed layout 200-2 are transferred to the bottom mask layer 109 by photolithography in the subsequent process. The material of the top mask layer 111 is, for example, silicon oxide, and the pattern of the other one of the decomposed layout 200-1 and the decomposed layout 200-2 are transferred to the top mask layer 111 by photolithography in the subsequent process. The material and etching rate of the bottom mask layer 109 are preferably different from those of the top mask layer 111. The photoresist bottom layer 113 may be a spin-on carbon (SOC) layer, which provides a relatively flat surface for the photoresist deposited or coated thereon, so as to facilitate subsequent exposure and development processes. The material of the photoresist intermediate layer 115 may be silicon oxynitride, and the bottom anti-reflective coating (BARC) layer 117 is disposed under the patterned photoresist layer 119, which may be used to reduce the reflected light between the photoresist and the substrate 101 during the exposure process.

Figure 5:
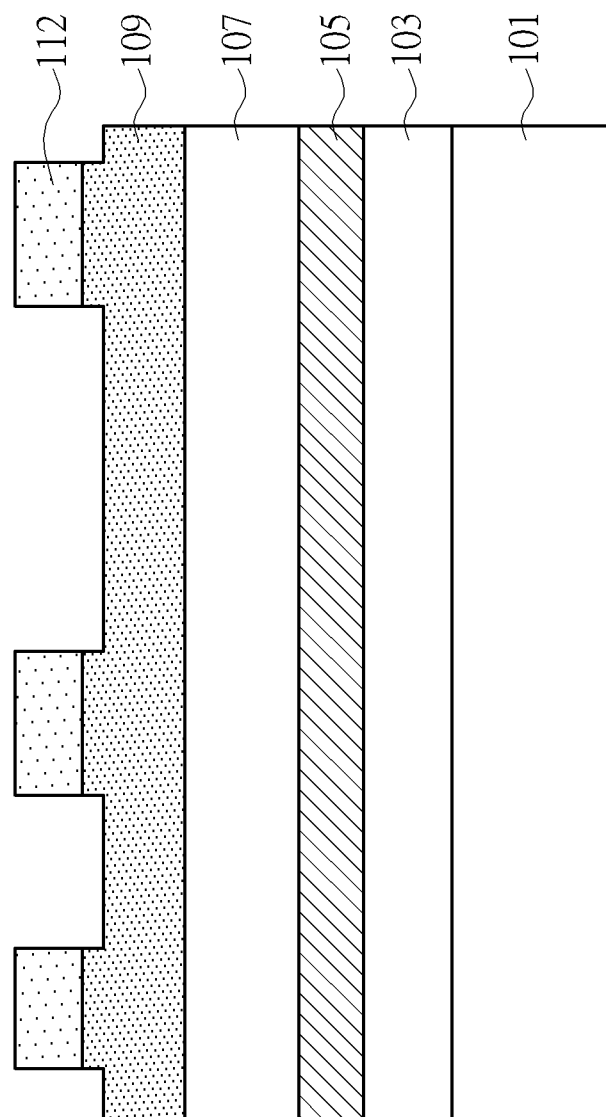

According to one embodiment of the present invention, one of the decomposed layout 200-1 and the decomposed layout 200-2, for example, the pattern of the decomposed layout 200-1 formed on a photomask, is transferred to the photoresist layer through exposure and development processes to form the patterned photoresist layer 119 shown in FIG. 4. In one embodiment, positive photoresists may be used, and the pattern of the patterned photoresist layer 119 may correspond to the pattern of the decomposed layout 200-1 on the photomask. However, according to actual requirements, negative photoresists may also be used. Then, referring to FIGS. 4 and 5, the pattern of the patterned photoresist layer 119 is transferred down to the top mask layer 111 by using an etching process to form a mask pattern 112, as shown in FIG. 5. In one embodiment, the pattern of the mask pattern 112 is also the same as the pattern of the decomposed layout 200-1 on the photomask, and includes the first connection patterns 211 and the modified cut portion 214-1.

Figure 6:
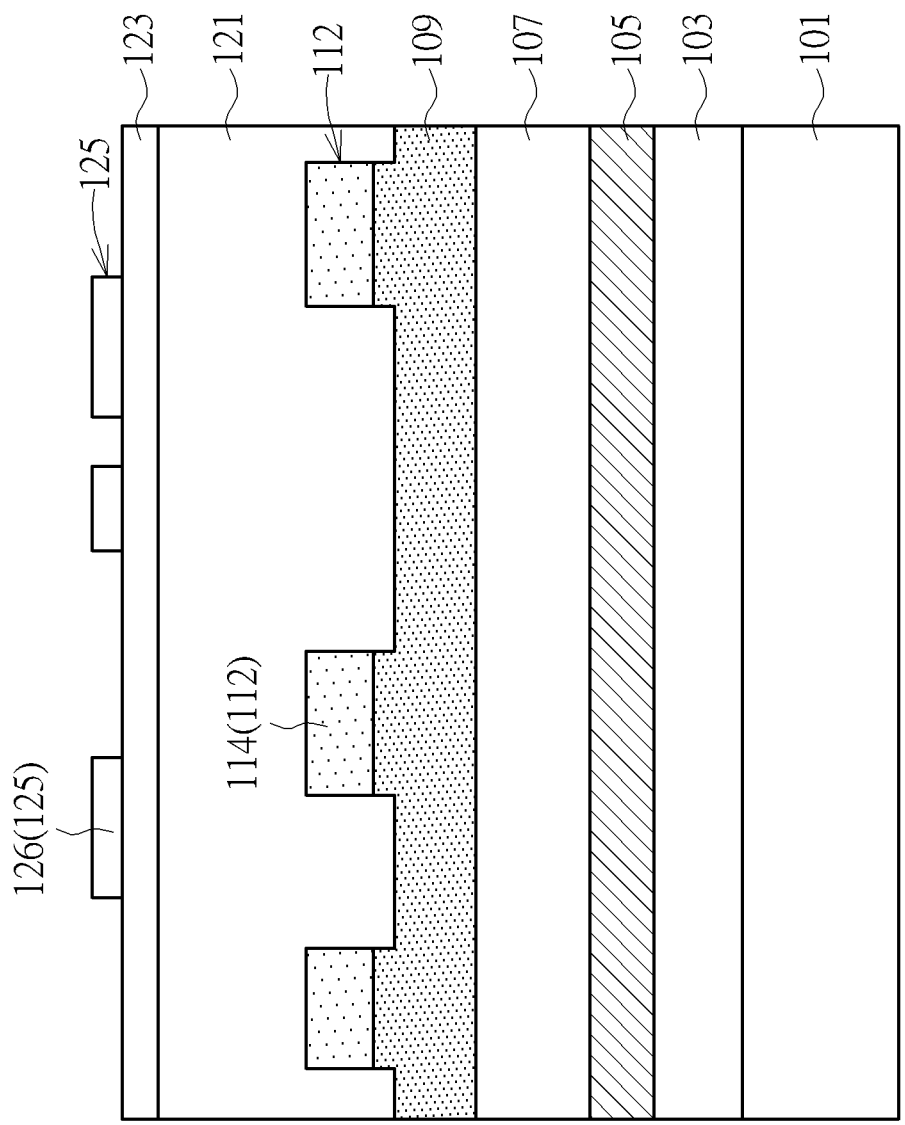

Then, as shown in FIG. 6, a photoresist bottom layer 121 and a photoresist intermediate layer 123 are sequentially deposited on the mask pattern 112 and the bottom mask layer 109, and a patterned photoresist layer 125 is formed, wherein the photoresist bottom layer 121 may be an organic dielectric layer (ODL) 121 to provide a flat surface on which photoresist is deposited or coated. The photoresist intermediate layer 123 may be a silicon-containing hard-mask bottom anti-reflection coating (SHB) layer. According to one embodiment of the present invention, another one of the decomposed layout 200-1 and the decomposed layout 200-2, for example, the pattern of the decomposed layout 200-2 formed on the another photomask, is transferred to the photoresist layer through exposure and development processes to form the patterned photoresist layer 125 shown in FIG. 6. In one embodiment, a positive photoresist may be used, and the pattern of the formed patterned photoresist layer 125 may correspond to the pattern of the decomposed layout 200-2 on the another photomask, including the second connection patterns 212 and the modified counterpart cutting portion 214-2.

According to one embodiment of the present invention, partial patterns 114 in the mask pattern 112 corresponds to the modified cutting portion 214-1 in the decomposed layout 200-1, while partial patterns 126 in the patterned photoresist layer 125 corresponds to the modified counterpart cutting portion 214-2 in the decomposed layout 200-2. Because the sides of the partial patterns 114 in the mask pattern 112 and the partial patterns 126 in the photoresist layer 125 partially overlap in the direction perpendicular to substrate 101, when the partial patterns 114 and the partial patterns 126 are transferred to the bottom mask layer 109 by etching process, the corresponding patterns formed in the bottom mask layer 109 may be regarded as merged patterns including the partial patterns 114 and the partial patterns 126.

Figure 7:
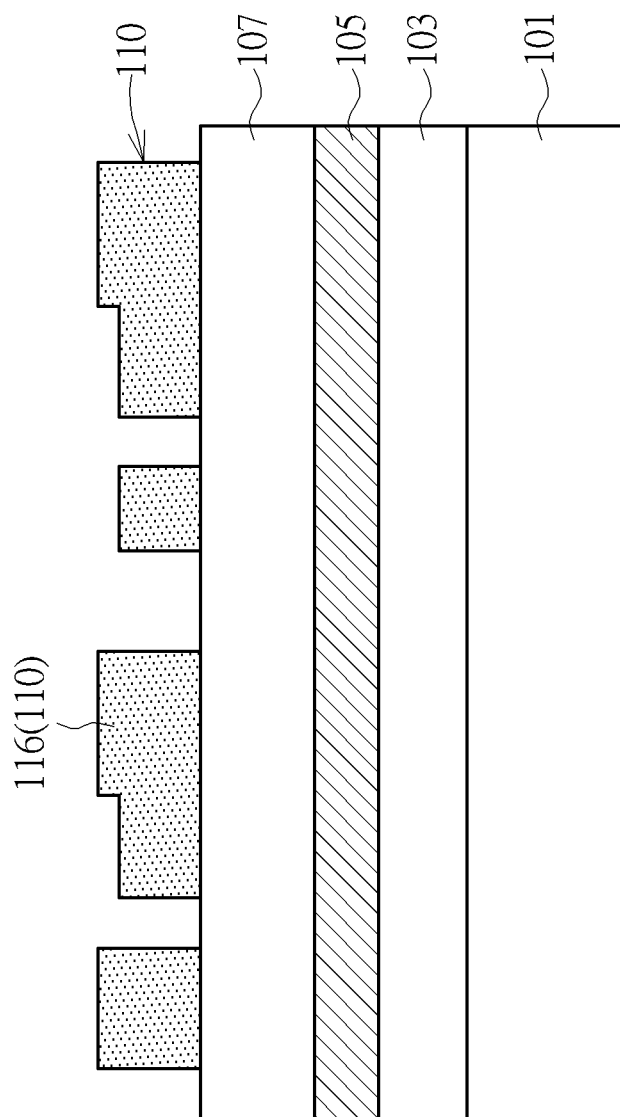

Then, referring to FIG. 6 and FIG. 7, the pattern of the patterned photoresist layer 125 and the pattern of the mask pattern 112 are transferred to the bottom mask layer 109 by etching process to form another mask pattern 110, as shown in FIG. 7. The pattern of the mask 110 may correspond to a pattern formed by combining the decomposed layout 200-1 on one photomask with the decomposed layout 200-2 on another photomask, and the merged pattern includes the first wiring patterns 211, the second wiring patterns 212, and a pattern formed by combining a modified cutting portion 214-1 and a modified counterpart cutting portion 214-2. As shown in FIG. 7, a merged pattern 116 in the mask pattern 110 is a pattern composed of the modified cut portion 214-1 and the modified counterpart cutting portion 214-2. Ideally, the top-view contour of the merged pattern 116 may be similar to the contour of the to-be-split pattern 213 in FIG. 1, however, in fact, due to the misalignment between two stacked layers during the photolithographic process, the patterned photoresist layer 119 and patterned photoresist layer 125 may be unintentionally laterally shifted in the first direction (such as x direction parallel to the main surface of the substrate 101), the second direction (such as y direction perpendicular to the x direction and parallel to the main surface of the substrate 101), and/or other directions parallel to the main surface of the substrate 101. Thus, the top-view contour of the merged pattern 116 may be different from the contour of the to-be-split pattern 213 in FIG. 1.

Figure 8:
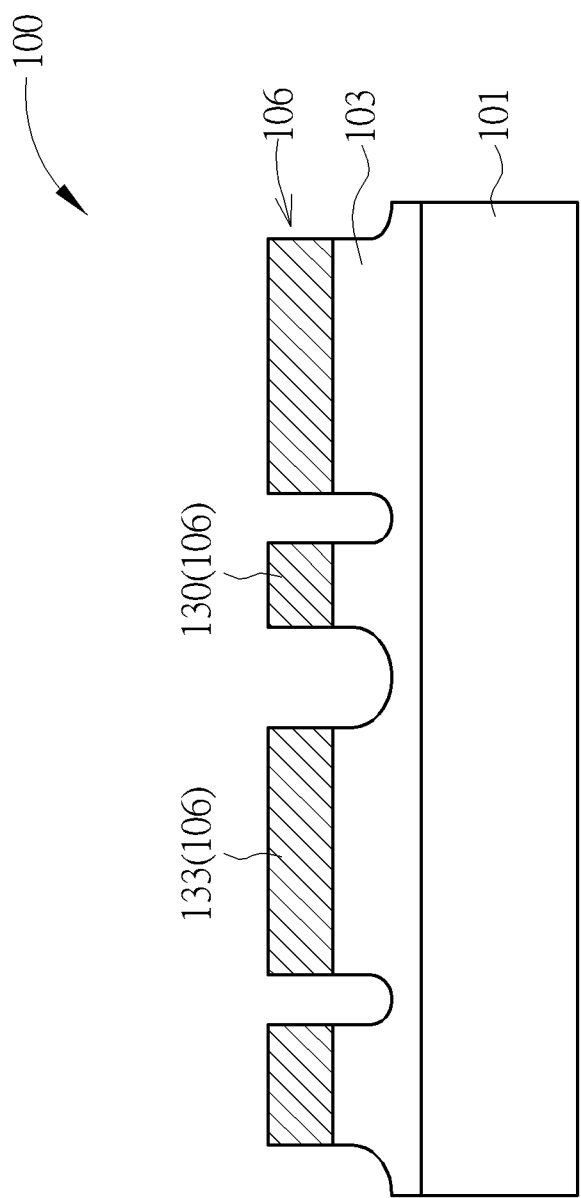

Then, referring to FIGS. 7 and 8, the pattern of the mask pattern 110 is transferred to the target layer 105 by an etching process to thereby form a patterned target layer 106 on the substrate 101, as shown in the semiconductor structure 100 shown in FIG. 8. In one embodiment, a portion of the diffusion barrier layer 103 under the patterned target layer 106 may also be patterned together. According to some embodiments of the present invention, the patterned target layer 106 includes a plurality of connection patterns 130 and a merged pattern 133. Ideally, the top-view contour of the merged pattern 133 may be similar to the contour of the to-be-split pattern 213 in FIG. 1, however, the actual top-view contour of the merged pattern 133 may be different from the contour of the to-be-split pattern 213 in FIG. 1.

Figure 9:
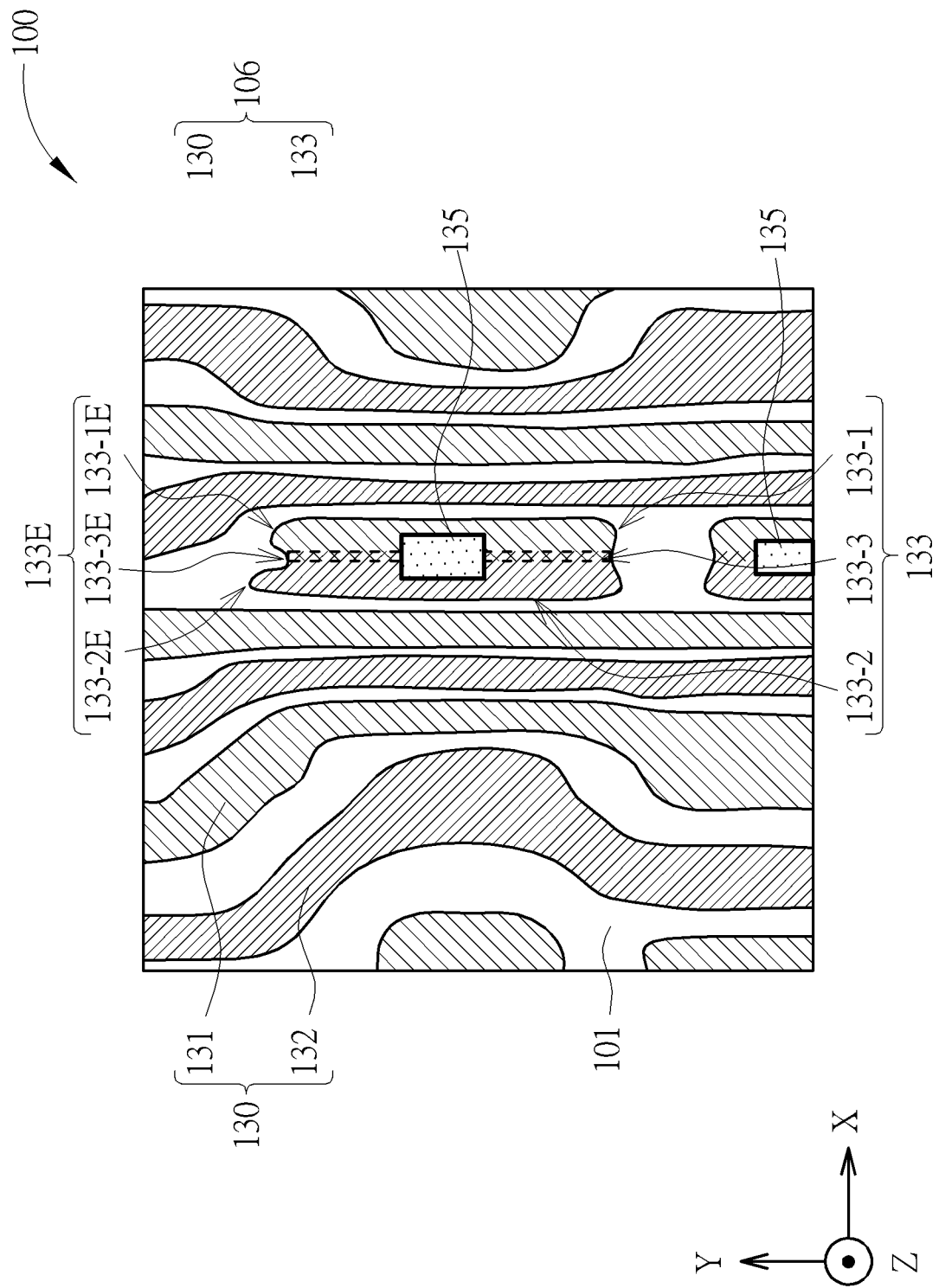
FIG. 9 is a schematic plan view of a semiconductor structure according to one embodiment of the present invention.

Referring to FIG. 9, which is a schematic plan view of a semiconductor structure according to one embodiment of the present invention. As shown in FIG. 9, the semiconductor structure 100 may be a top view of FIG. 8, which includes the connection patterns 130 and a merged pattern 133 disposed on the substrate 101, and the patterned target layer 106 of FIG. 8 includes the connection patterns 130 and the merged patterns 133 shown in FIG. 9. In one embodiment, the semiconductor structure 100 may be a partial structure of a semiconductor memory device, the substrate 101 includes a plurality of active regions (not shown in the figure), and the connection patterns 130 are a plurality of conductive line patterns, and each of the conductive line patterns is electrically connected to each of the active regions. The connection patterns 130 include the first connection patterns 131 and the second connection patterns 132, and the first connection patterns 131 and the second connection patterns 132 are alternately arranged along the first direction (for example, along the x direction shown in FIG. 9). The merged pattern 133 is disposed between the adjacent two of the connection patterns 130, that is, the merged pattern 133 is disposed between the first connecting line 131 and the second connecting line 132 adjacent to the first connecting line 131. In addition, each of the connection pattern 130 and the merged pattern 133 extend along the second direction (for example, along the y direction shown in FIG. 9), and the second direction is perpendicular to the first direction.

According to one embodiment of the present invention, the contour of the integrated pattern 133 is defined by the cutting portion 213-1 and the counterpart cutting portion 213-2 of FIG. 1, and the merged pattern 133 includes a first outer line 133-1, an central line 133-3 and a second outer line 133-2 which are sequentially arranged and connected along the first direction. The major axis of the first outer line 133-1, the major axis of the central line 133-3 and the major axis of the second outer line 133-2 are parallel to each other. In one embodiment, the length of the first outer line 133-1 is not equal to the length of the second outer line 133-2, and the width of the merged pattern 133 is larger than the width of each of the first connection patterns 131 and each of the second connection patterns 132. In addition, an end surface 133-1E of the first outer line 133-1, an end surface 133-3E of the central line 133-3 and an end surface 133-2e of the second outer line 133-2 are misaligned to each other along the first direction so that an end surface 133E of the merged pattern 133 includes a recessed region and protruded regions. In detail, the recessed region corresponds to the end surface 133-3E of the central line 133-3, and the protruded regions correspond to the end surface 133-1E of the first outer line 133-1 and the end surface 133-3E of the second outer line 133-3. The merged pattern 133 further includes another end surface which is disposed opposite to the end surface 133E in the second direction. Similar to the end surface 133, the another end surface also includes a recessed region and a protruded region. In addition, the recessed region and the protruded region of both end surfaces of the merged pattern 133 include curved surfaces respectively.

In addition, the semiconductor structure 100 further includes a contact structure 135 disposed on the patterned target layer 106, and the contact structure 135 overlaps the merged pattern 133 in a third direction (for example, in the z direction shown in FIG. 9), where the third direction is perpendicular to the surface of the substrate 101. The contact structure 135 may be a conductive structure, which may be electrically connected to not only the merged pattern 133 underneath but also other structures above, such as an interconnection structure. Since the width of the merged pattern 133 that supports the contact structure 135 is larger than the width of each of the first connection patterns 131 and each of the second connection patterns 132, the merged pattern 133 may be split into two portions, namely the original counterpart cutting portion and the original cutting portion, during the decomposition of the layout, and these two portions may be formed on different photomasks respectively. During the photolithography, if overlay errors or inaccurate alignments occur, the merged pattern used to support the contact structure may be separated from each other, resulting in open circuit or short circuit of the formed circuit.

Figure 10:
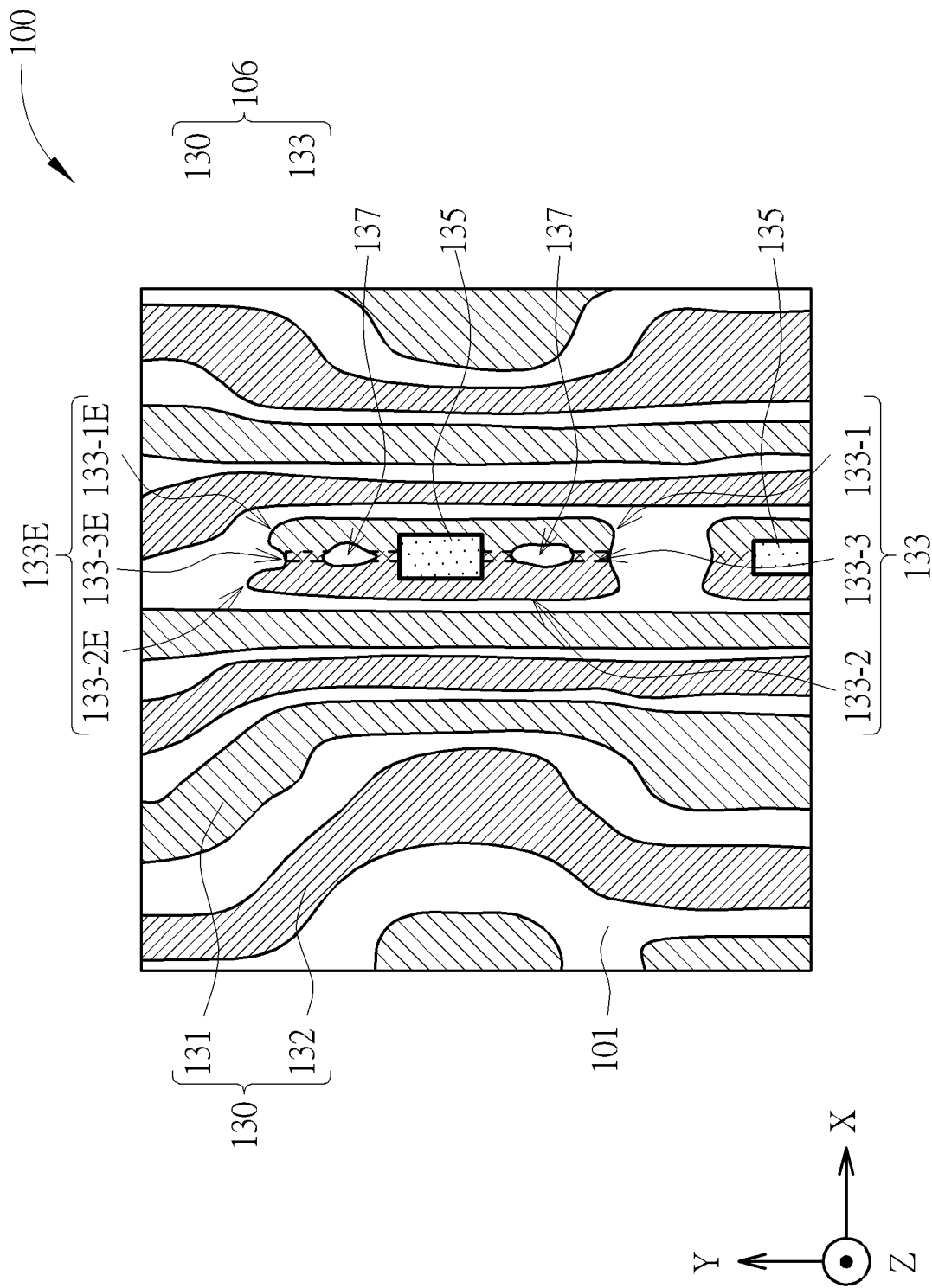
FIG. 10 is another schematic plan view of a semiconductor structure according to one embodiment of the present invention.

FIG. 10 is a schematic plan view of a semiconductor structure according to another embodiment of the present invention. The structure of FIG. 10 is similar to that shown in FIG. 9, but the main difference is that the pattern 133 of FIG. 10 includes at least one cavity, for example, two cavities 137. The cavity 137 may be located between the first outer line 133-1 and the second outer line 133-2, so that the central line 133-3 located between the first outer line 133-1 and the second outer line 133-2 is thereby distributed discontinuously in the second direction (for example, in the y direction shown in FIG. 9). In the decomposed layout 200-1 and the decomposed layout 200-2 in FIGS. 2 and 3, the layout patterns corresponding to the first outer line 133-1 and the second outer line 133-2 have been modified (the area of the layout patterns is increased), so the first outer line 133-1 and the second outer line 133-2 may not be completely separated by the cavity 137 even if overlay errors or inaccurate alignment occur during the photolithography. In addition, since the contact structure 135 is formed later than the merged pattern 133, a portion of the contact structure 135 may be filled into the cavity 137 when at least a portion of the contact structure 135 overlaps the cavity 137. Therefore, an increased contact area between the contact structure 135 and the merged pattern 133 is obtained.

According to one embodiment of the present invention, when fabricating a semiconductor layout, the boundary line 213L between the original counterpart cutting portion 213-2 and the original cutting portion 213-1 of the to-be-split pattern 213 is moved so that the area of the modified counterpart cutting portion 214-2 is larger than that of the original counterpart cutting portion 213-2, and the area of the modified cutting portion 214-1 is also larger than that of the original cutting portion 213-1. Besides, there is an intermediate overlapping area between the modified counterpart cutting portion 214-2 and the modified cutting portion 214-1. Hence, when the modified counterpart cutting portion 214-2 and the modified cutting potion 214-1 are used to fabricate the merged pattern 133, the reliability of the merged pattern 133 for supporting the contact structure 135 may be ensured. Therefore, by using the method for fabricating semiconductor layout and the method for fabricating semiconductor structure according to the embodiments of the present invention, the fabricated semiconductor structure may improve the reliability of the electrical connection between the fabricated circuit wires and the contact pads under the condition that the spacing between the adjacent two of the connection lines and the spacing between the connection line and the to-be-split pattern adjacent to the connection pattern violate the predetermined rule of photolithography, and no additional photolithography are required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor structure, comprising:
    providing a layout, wherein the layout comprises a plurality of connection patterns and at least one to-be-split pattern;
    decomposing the layout to a plurality of first connection patterns and a plurality of second connection patterns alternatively arranged with each other, wherein the to-be-split pattern is disposed between one of the first connection patterns and one of the second connection patterns adjacent to one of the first connection patterns;
    splitting the to-be-split pattern into a cutting portion and a counterpart cutting portion;
    forming a first photomask having a layout constructed by one of the first connection patterns and the cutting portion;
    forming a second photomask having a layout constructed by one of the second connection patterns and the counterpart cutting portion;
    providing a substrate, wherein a target layer is disposed on the substrate;
    transferring the layout of the first photomask and the layout of the second photomask to the target layer to thereby form the plurality of connection patterns and a merged pattern, wherein a contour of the merged pattern is defined by the cutting portion and the counterpart cutting portion, the merged pattern comprises at least one cavity and two end surfaces disposed opposite each other, and each of the end surfaces comprises a recessed region and a protruded region, and
    after forming the plurality of connection patterns and the merged pattern, forming a contact structure on the merged pattern, wherein a portion of the contact structure is filled into the at least one cavity.

2. The method for fabricating the semiconductor structure of claim 1, wherein a spacing between adjacent two of the plurality of connection patterns in the layout and a spacing between one of the connection pattern and the to-be-split pattern adjacent to the connection pattern violate a predetermined rule of a photolithography process.

3. The method for fabricating the semiconductor structure of claim 1, wherein a boundary line is located between the cutting portion and the counterpart cutting portion, and the method further comprises:
    moving a boundary line of the cutting portion to increase an area of the cutting portion.

4. The method for fabricating the semiconductor structure of claim 3, further comprises:
    moving a boundary line of the counterpart cutting portion to increase an area of the counterpart cutting portion.

5. The method for fabricating the semiconductor structure of claim 3, wherein a ratio of the area of the cutting portion after moving the boundary line to the area of the cutting portion before moving the boundary line is 1.05 to 1.50.

6. The method for fabricating the semiconductor structure of claim 1, further comprising:
    cutting off at least one upper corner of the to-be-split pattern to be a bevel edge.

7. The method for fabricating the semiconductor structure of claim 1, further comprising:
    forming the target layer, a bottom mask layer and a top mask layer sequentially on the substrate before forming the connection patterns and the merged pattern;
    transferring one of the layout of the first photomask and the layout of the second photomask into the top mask layer to thereby form a mask pattern;

transferring the other one of the layout of the first photomask and the layout of the second photomask into the bottom mask layer to thereby form another mask pattern; and transferring the another mask layer into the target layer.

8. The method for fabricating the semiconductor structure of claim 1, wherein the recessed region and the protruded region comprise curved surfaces respectively.

9. The method for fabricating the semiconductor structure of claim 1, wherein a width of the merged pattern is larger than a width of each of the connection patterns.

10. The method for fabricating the semiconductor structure of claim 1, wherein the merged pattern comprises a first outer line, central line and second outer line sequentially arranged along a first direction and connected with each other, and an end surface of the first outer line, an end surface of the central line and an end surface of the second outer line are misaligned along the first direction.

* * * * *